(12) United States Patent
Naji

(10) Patent No.: US 6,304,477 B1
(45) Date of Patent: Oct. 16, 2001

(54) CONTENT ADDRESSABLE MAGNETIC RANDOM ACCESS MEMORY

(75) Inventor: Peter K. Naji, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/774,934

(22) Filed: Jan. 31, 2001

(51) Int. Cl.[7] .................................................. G11C 15/02
(52) U.S. Cl. .......................... 365/50; 365/158; 365/171; 365/173
(58) Field of Search ............................. 365/50, 158, 171, 365/173, 207, 55, 66

(56) References Cited

U.S. PATENT DOCUMENTS 6,175,515 * 1/2001 Peczalski et al. .................... 365/50

* cited by examiner

Primary Examiner—David Nelms
Assistant Examiner—David Lam
(74) Attorney, Agent, or Firm—William E. Koch

(57) ABSTRACT

A content addressable magnetic random access memory cell including a differentially connected pair of MTJs and comparison and match detection circuitry connected to the MTJs and including differential tag bitlines, differential tag program bitlines, an enable line, a word line, a digit line, and a match line. The match line provides an indication of a match between input data placed on the differential tag bitlines and stored data in the cell.

11 Claims, 5 Drawing Sheets

10

US 6,304,477 B1

CONTENT ADDRESSABLE MAGNETIC RANDOM ACCESS MEMORY

FIELD OF THE INVENTION

This invention relates to computer memories and more specifically to cache memories and the like.

BACKGROUND OF THE INVENTION

In computers, a cache memory is a fast memory located close to the CPU that holds the most recently accessed code or data. When the data is not found in the cache a cache miss occurs and data is retrieved from the main memory, and put into the cache. During this time the CPU is interrupted and placed in a wait state until the data is available.

The CPU sends an address into the cache to examine the cache, which contains words stored in the cache. The data stored in each cell is commonly referred to as a "tag" and a tag word is formed by a row of tags or memory cells. If the word addressed by the CPU is found in the cache, it is read from the cache. If not, the main memory is addressed to read the word. A block of words containing the word just accessed is then transferred from the main memory to the cache.

The cache memory receives addresses from the CPU and performs a search and comparison with addresses stored in the cache. To perform this comparison in parallel at high speed, an associative or content addressable memory (CAM) is required. The time to access information in a memory can be reduced drastically if the stored data can be identified by the content rather than by an address. CAMs or associative memories are used extensively in cache memories and translation look-aside buffers (TLB). Generally, CAMs are used in caches to translate physical addresses to data and in TLBs to translate virtual addresses to physical addresses. CAMs are an extremely powerful tool for associative data processing.

Speed is important in cache memories because, in general, a cache memory should be a factor of 5 to 10 faster than the main memory. To date, only SRAMs have the speed necessary for cache memories and the like.

In the prior art, most cache memories are composed of an array of SRAMs. SRAM type of memory cells have the required speed but they are volatile memories. In the prior art, SRAM cells are formed in an array with all of the comparison and match detection circuitry positioned at the periphery or otherwise external to the array. Also, SRAM based CAMs cannot be turned off at the cell but masking must be take place in the periphery, which results in wasted power. Further, different memory cells are generally used in the main memory so that the cache memory and the main memory require different processing and fabrication steps.

Accordingly it is highly desirable to provide cache memories which overcome these problems.

BRIEF DESCRIPTION OF THE DRAWINGS

Referring to the drawings.

DESCRIPTION OF THE PREFERRED EMBODIMENT

Figure 1:
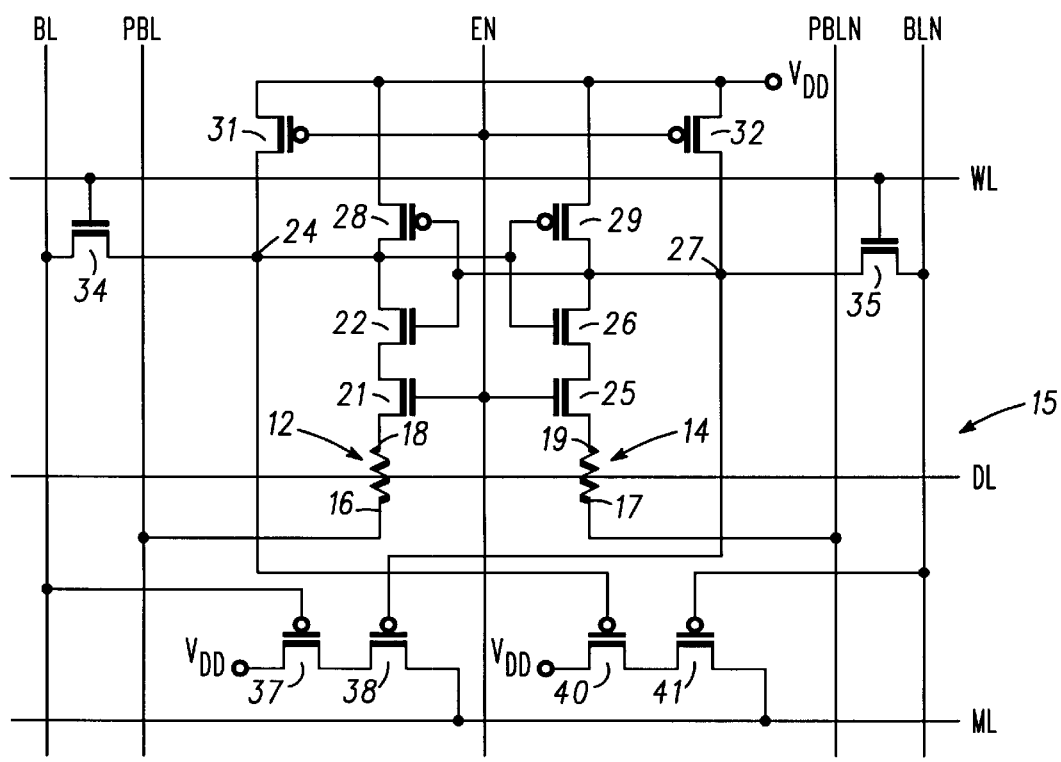
FIG. 1 is a schematic diagram of a content addressable magnetic random access memory (CAMRAM) in accordance with the present invention.

Turning now to FIG. 1, a content addressable magnetic random access memory cell 10 is illustrated in accordance with the present invention. Cell 10 includes a differentially connected pair of magnetic tunnel junctions (MTJS) 12 and 14. An MTJ is used by connecting it in a circuit such that electricity flows vertically through a stack of layers forming the MTJ from one magnetic layer to another. The MTJ can be electrically represented as a resistor and the size of the resistance depends upon the orientation of two magnetic vectors in either of two stable states. As is understood by those skilled in the art, the MTJ has a relatively high resistance when the magnetic vectors are misaligned (point in opposite directions) and a relatively low resistance when the magnetic vectors are aligned. MTJs are well known in the art and will not be discussed in detail herein. However, additional information as to the fabrication and operation of MTJs can be found in U.S. Pat. No. 5,702,831, entitled "Multi-Layer Magnetic Tunneling Junction Memory Cells", issued Mar. 31, 1998, and incorporated herein by reference.

Cell 10 further includes comparison and match detection circuitry 15 connected to the differentially connected pair of MTJs 12 and 14. Circuitry 15 includes differential tag bitlines designated BL and BLN (bitline-not), differential tag program bitlines designated PBL and PBLN, an enable line designated EN, a word line designated WL, a digit line designated DL, and a match line designated ML, the match line providing an indication of a match between input data placed on the differential tag bitlines and stored data in the cell.

More specifically, a lower (in FIG. 1) terminal 16 of MTJ 12 is connected directly to tag program bitline PBL and a lower (in FIG. 1) terminal 17 of MTJ 14 is connected directly to tag program bitline-not PBLN. For reasons that will be explained in more detail presently, lower terminals 16 and 17 of MTJs 12 and 14 are at the top of the stacks of layers which form the MTJs and upper terminals 18 and 19, respectively, are at the bottom of the stack. Upper terminal 18 of MTJ 12 is connected through a first switching transistor 21 and a second switching transistor 22 to a junction 24. Upper terminal 19 of MTJ 14 is connected through a first switching transistor 25 and a second switching transistor 26 to a junction 27. The control terminals or gates of switching transistors 21 and 25 are connected directly to enable line EN. The gate of switching transistor 22 is connected directly to junction 27 and the gate of switching transistor 26 is connected directly to junction 24.

A switching transistor 28 is connected between a power supply, designated vdd, and junction 24 and a switching transistor 29 is connected between power supply Vdd and junction 27. The control terminal or gate of switching transistor 28 is connected directly to junction 27 and the control terminal or gate of switching transistor 29 is connected directly to junction 24. A pair of switching transistor 31 and 32 are connected between power supply Vdd and junctions 24 and 27, respectively. The control terminals or gates of switching transistor 31 and 32 are both connected directly to enable line EN.

A switching transistor 34 is connected between tag bitline BL and junction 24 with the control terminal or gate connected directly to word line WL. A switching transistor 35 is connected between tag bitline-not BLN and junction 27 with the control terminal or gate connected directly to word line WL. A pair of series connected switching transistors 37 and 38 are connected between power supply Vdd and match line ML. The control terminal or gate of transistor 37 is connected directly to tag bitline BL and the control terminal or gate of transistor 38 is connected directly to junction 27. Another pair of series connected switching transistors 40 and 41 are connected between power supply Vdd and match line ML. The control terminal or gate of transistor 40 is connected directly to junction 24 and the control terminal or gate of transistor 41 is connected directly to tag bitline-not BLN.

Figure 2:
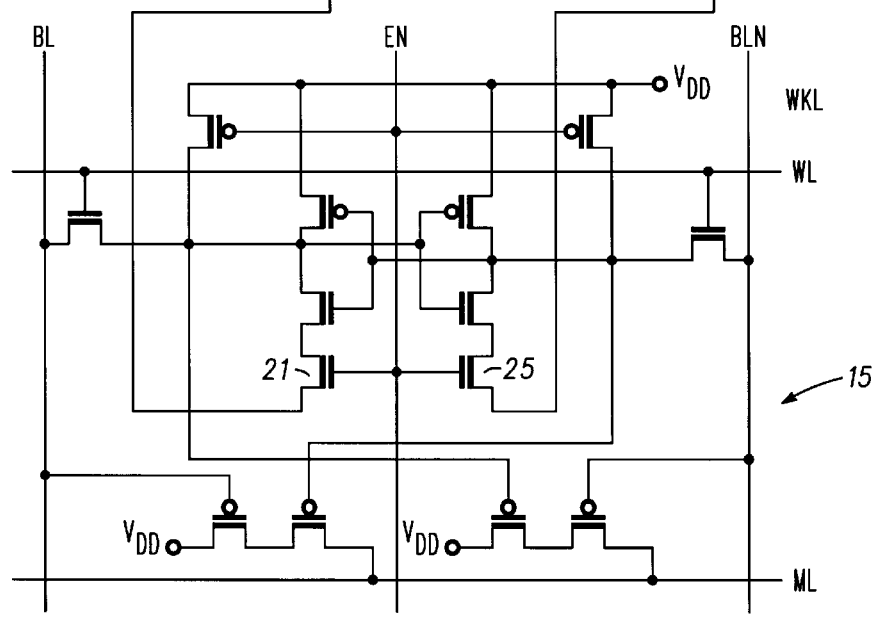
FIG. 2 is a partial isometric partial schematic diagram of the CAMRAM of FIG. 1.
Figure 3:
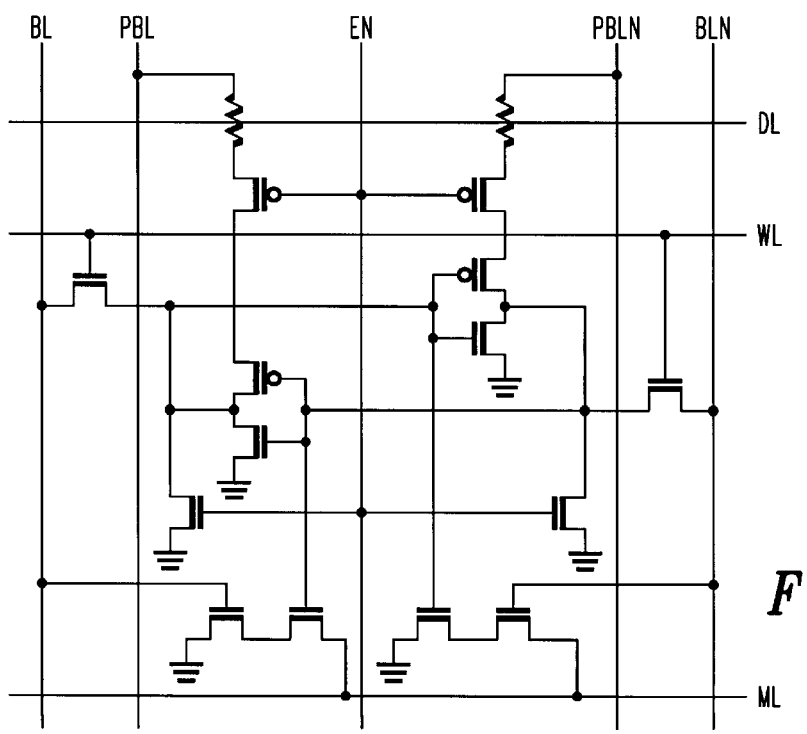
FIGS 3, 4, 5, and 6 illustrate additional embodiments of a content addressable magnetic random access memory (CAMRAM) in accordance with the present invention.
Figure 4:
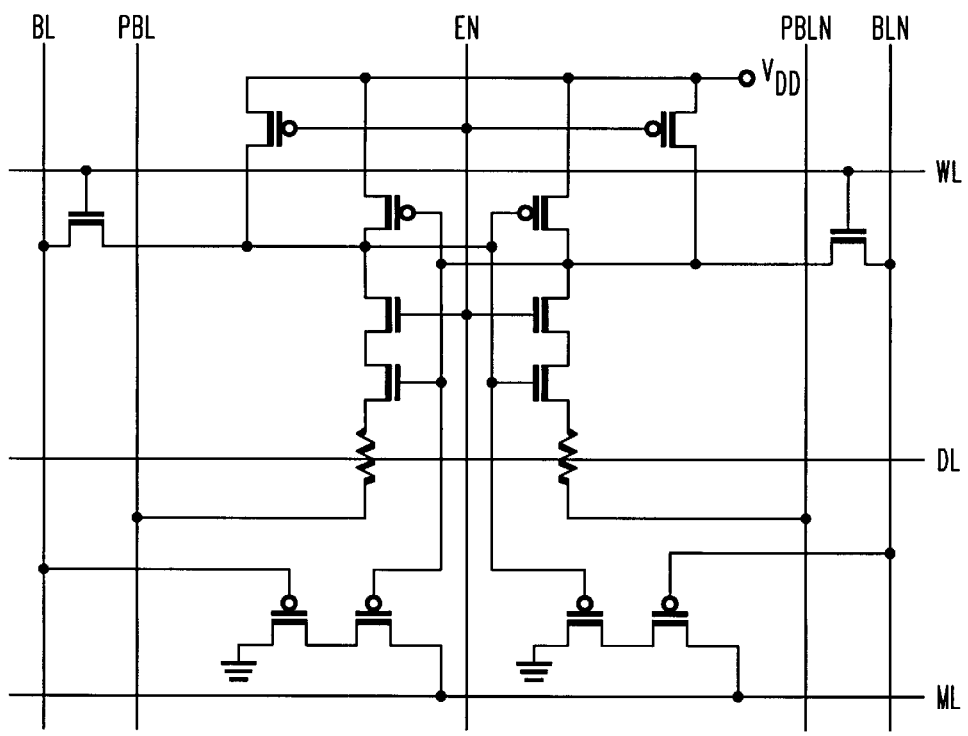
Figure 5:
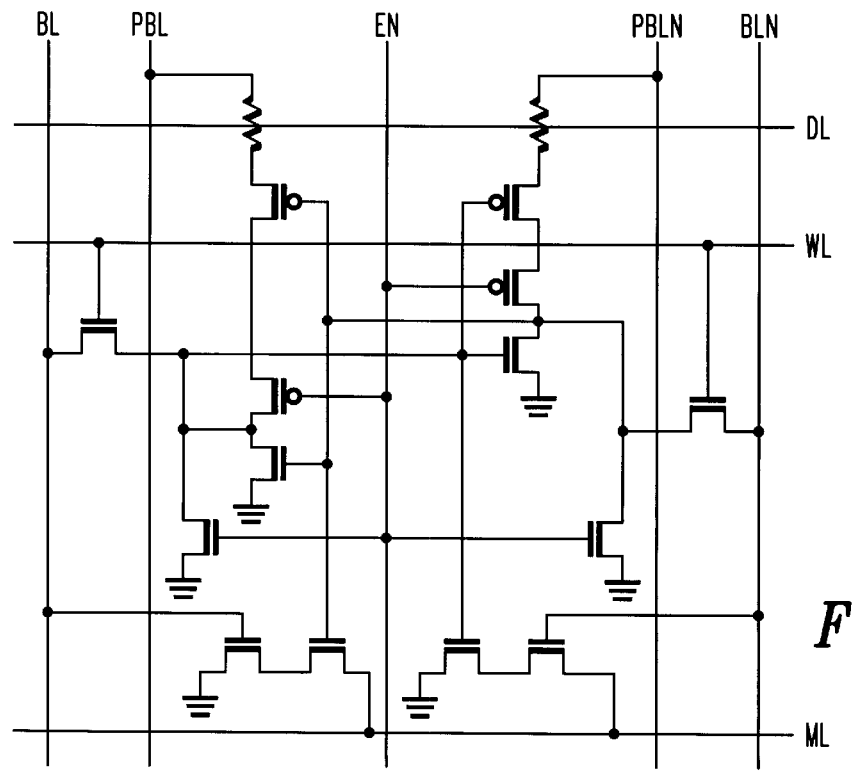
Figure 6:
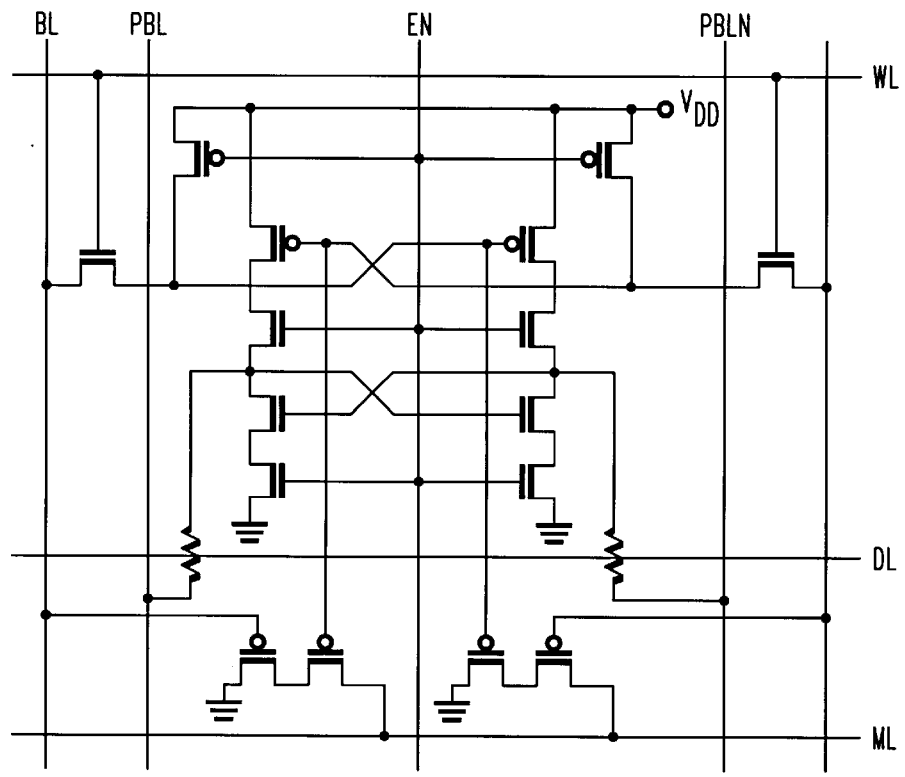

Referring additionally to FIG. 2, MTJs 12 and 14 are illustrated as stacks of layers of magnetic material, insulating material, and non-magnetic conductors assembled in a well known manner. Comparison and match detection circuitry 15 is formed in and on the surface of a supporting semiconductor substrate (not shown) generally below MTJs 12 and 14. MTJ 12 includes a bottom layer of conductive material 45 positioned in a layer above circuitry 15 and connected by way of a via 46 to switching transistor 21. MTJ 14 includes a bottom layer of conductive material 47 (generally formed from the same layer as material 45) positioned in a layer above circuitry 15 and connected by way of a via 48 to switching transistor 25.

Digit line DL is formed to extend beneath both MTJs 12 and 14 and sufficiently close to produce a partial programming magnetic field in MTJs 12 and 14. Tag programming bitline PBL is positioned above MTJ 12, sufficiently close to produce a partial programming magnetic field in MTJ 12, and is oriented perpendicular to digit line DL. Similarly, tag programming bitline-not PBLN is positioned above MTJ 14, sufficiently close to produce a partial programming magnetic field in MTJ 12, and is oriented perpendicular to digit line DL. Thus, digit line DL, tag programming bitline PBL and tag programming bitline-not PBLN are used to address each individual cell during programming of the memory.

Referring to FIGS. 3, 4, 5, and 6, several additional embodiments are illustrated of content addressable magnetic random access memories (CAMRAMs) in accordance with the present invention. The various embodiments illustrate potential changes in the connecting circuitry, such as different conducting transistors (e.g., N-conduction and P-conduction) and different positions of the various components. A macro view of CAMRAM cell 10, or any of the other cell embodiments, is illustrated in FIG. 7 showing the various I/O connections.

Figure 7:
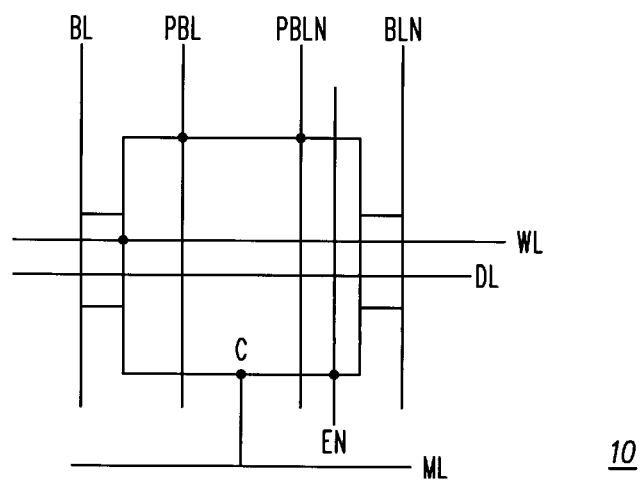
FIG. 7 is a CAMRAM cell macro view illustrating various I/O connections.
Figure 8:
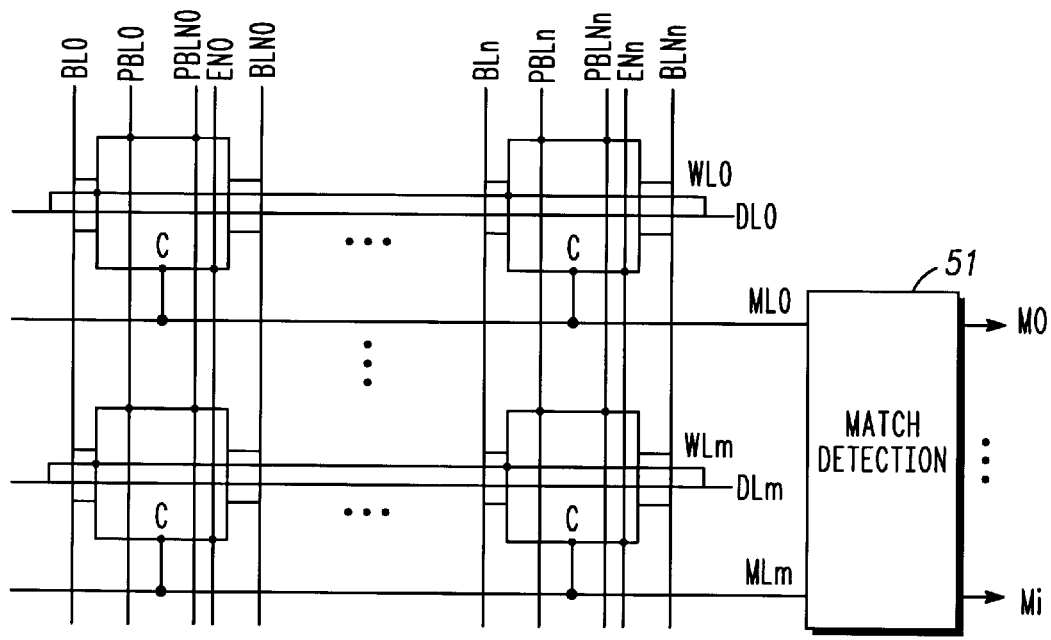
FIG. 8 illustrates an array of CAMRAM cells.

Turning now to FIG. 8, an array 50 of CAMRAM cells each similar to cell 10 of FIG. 7 is illustrated. The CAMRAM cells in the array are arranged in rows and columns, with n cells in each row and m cells in each column, where n and m indicate any whole integer. Each of the cells in the array are coupled by the tag bitlines and tag bitlines-not (designated BL0 through BLn and BLN0 through BLNn, respectively), and the enable lines (designated EN0 through ENn) extending along the columns and the word lines (designated WL0 through WLm), the digit lines (designated DL0 through DLm), and the match lines (designated ML0 through MLm) extending along the rows. The match lines ML0 through MLm are coupled to a match detection circuit 51 which detects a match on any of the match lines and outputs a match signal (designated M0 through Mi).

Complementary information is programmed into each of the cells in array 50 by the following process, with reference back to FIG. 1. Disable the cell being programmed by applying a logic 0 to the enable line (EN=0). During the disabled time, junctions 24 and 27 will be held at Vdd, which is important for a fast transition to read and search modes occurring immediately after a program operation. Simultaneously, the word line is disabled by applying a logic 0 (WL=0). Select a pair of program bitlines PBL and PBLN, or all pairs of program bitlines for high speed programming, and select one digit line DL. By passing the appropriate current through the selected program bitlines PBL and PBLN and the selected digit line DL, the selected cell along a specific row will be programmed. For example, selecting PBL0 and PBLN0 selects the first column of cells. Selecting DL0 selects the first cell in the first column. Appropriate currents applied to lines PBL0, PBLN0, and DL0 will then program the first cell in the first column with the desired complementary information.

In the search mode, the following process is performed. Enable a selected column of cells in array 50 by applying a logic 1 to the selected enable line (EN=1), raising the enable line from the disable state (EN=0). Simultaneously, disable the word line (WL=0). When the cell is disabled (EN=0), the match line ML should be precharged to ground. Ground the tag bitlines PBL and PBLN. Once the cell is enabled and the tag bitlines are grounded, a regenerative +Vc feedback developed by transistors 28, 22, 21, and MTJ 12 and transistors 29, 26, 25 and MTJ 14 will keep junction 24 at Vdd and will pull junction 27 to a voltage close to ground, or vice versa, that is will keep junction 27 at Vdd and will pull junction 24 to a voltage close to ground. The voltages on junctions 24 and 27 appear at the gates of transistors 40 and 38, respectively. Thus, either transistors 40 and 41 or transistors 37 and 38 will pull match line ML up depending upon the input address on tag bitline BL and $BL_N$.

Now array 50 is ready to start the search. As a result, the enable line is set high and a high speed parallel search can begin. An input word ($BL_o \ldots BL_N$) is compared with the data stored in a row of array 50. The data stored in each CAMRAM cell 10 is known as a "tag" and a tag word is formed by a row of CAMRAM cells 10. Each row of CAMRAM cells 10, or each tag word, is connected to a match line ($ML_o \ldots ML_N$). If there is a mismatch in any bit of the tag word, the corresponding match line is pulled down. If all bits in a tag word match the input word, the corresponding match line remains high. Match detection circuit 51 detects the transitions of the match lines and stores the result in a register. Masking of one or more bits in array 50, herein referred to as a "masked interrogate bit position", is easily accomplished by pulling the enable line of desired bits low. The bits with a low enable line will turn off the CAMRAM cells along the corresponding column, hence providing local masking and power saving.

In the read mode of operation, the CAMRAM can be used as a random access memory or can be designed to be accessed sequentially. The read mode operation is as follows. When the enable line is disabled (EN=0), precharge the tag bitlines BL and BLN to Vdd. Junctions 24 and 27 and bitlines BL and BLN will be at Vdd. Ground programming bitlines PBL and PBLN. Disable match detection circuitry 51, since during the read operation tag bitlines BL and BLN will assume either logic high or logic low levels which will turn transistors 37 and 41 on or off, hence causing match line ML to move. Disabling match detection circuitry 51 during random access will prevent unnecessary transitioning of match detection circuitry 51. Enable word line WL (WL=1) and enable the selected cell (EN=1). Depending upon the state of MTJs 12 and 14, junctions 24 and 27 will be at Vdd or a voltage slightly above ground. If junction 24 or 27 is at Vdd, tag bitline BL or BLN, respectively, will stay at Vdd. However, if junction 24 or 27 is at voltage slightly above ground, tag bitline BL or BLN, respectively, will get pulled down towards ground, at which time a high speed sense amplifier (not shown) will sense the voltage on tag bitlines BL and BLN differentially at high speed and output the sensed data. Here it will be understood that the scanning mechanism can be either in a voltage or current mode.

Preferably, transistors 21, 22, and 28 and transistors 25, 26, and 29 and the resistances of MTJs 12 and 14 are selected such that the voltage across the MTJs 12 and 14 is in a range of approximately 100 mV to 400 mV. In this range maximum MR (the ratio between the maximum resistance and the minimum ressitance) can be achieved. In general, the lower the voltage across MTJs 12 and 14 the higher the MR and the lower the current consumption.

Since single MTJ cells are subject to resistance variations due to processing, bias voltage variations, temperature, etc. accounting for these variations will result in speed degradation. However, a dual MTJ cell programmed in a differential fashion as in the CAMRAM cell described herein, all such variations are common mode and are automatically eliminated. In addition, the available output signal is doubled by the dual MTJs and the differential operation. In addition, where single MTJ cells are used in the main memory with data sensing and processing at the ends of the memory array (see for example copending application entitled "HIGH DENSITY MRAM CELL ARRAY" filed on , 2000, bearing serial NO. and assigned to the same assignee), the CAMRAM is much faster than the main memory.

Here it should also be noted that CAMRAM cells can be masked locally in the cell without losing information, while CAM cells based on SRAMs cannot be masked because they cannot be turned off at the cell and masking has to take place in the periphery of the array. The local masking of CAMRAM cells will result in substantial power saving. CAMRAM cells are masked via the enable line EN input of the cell which is connected to the enable line EN connecting a column of cells. Further, the CAMRAM cells do not require any deviation from the standard MTJ structure used in high density MRAMs (see above sighted copending application).

Thus, a new and improved content addressable magnetic random access memory cell is disclosed which is at least as fast as an SRAM based memory and is nonvolatile. Also, the bitline voltage remains relatively constant whether matches or mismatches are found during a search. Because of the differential operation of each cell, resistance variations due to processing, bias voltage variations, temperature, etc. will be eliminated automatically and speed does not have to be sacrificed for operation. Further, the differential operation provides larger output signals for more efficient sensing and operation.

Because of the nonvolatility of the CAMRAM cells, new cache designs will be generated and new CPU architectures will result. High speed search engines can be designed using the new CAMRAM cells which will result in a large number of systems and applications for associative data processing.

It will be understood by those skilled in the art that a bit line is generally associated with each column of an array of MTJ cells and a digit line is associated with each row of the array. The bit lines and digit lines are used to address individual cells in the array for both reading and programming or storing information in the array. As will be understood by those skilled in the art columns and rows can be easily interchanged and it is intended in this disclosure that such terms be interchangeable. Also, specific names of the various lines, e.g., bit line, word line, digit line, select line, etc. are intended to be generic names used only to facilitate the explanation and are not intended in any way to limit the invention.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A magnetic random access memory cell comprising:
   a differentially connected pair of magnetic tunnel junctions; and
   programming and detection circuitry connected to the differentially connected pair and including differential bitlines, differential program bitlines, an enable line, a word line, and a digit line.

2. A content addressable magnetic random access memory cell comprising:
   a differentially connected pair of magnetic tunnel junctions; and
   comparison and match detection circuitry connected to the differentially connected pair and including differential tag bitlines, differential tag program bitlines, an enable line, a word line, a digit line, and a match line, the match line providing an indication of a match between input data placed on the differential tag bitlines and stored data in the cell.

3. A content addressable magnetic random access memory cell as claimed in claim 2 wherein the differentially connected pair of magnetic tunnel junctions and the comparison and match detection circuitry are formed on a common supporting substrate.

4. A content addressable magnetic random access memory cell as claimed in claim 2 wherein the differentially connected pair of magnetic tunnel junctions form a nonvolatile memory.

5. A content addressable magnetic random access memory cell as claimed in claim 2 wherein the differential tag bitlines and the differential tag program bitlines include a tag bitline coupled to a first of the differentially connected pair of magnetic tunnel junctions, a tag bitline-not coupled to a second of the differentially connected pair of magnetic tunnel junctions, a tag program bitline connected to the first of the differentially connected pair of magnetic tunnel junctions, and a tag program bitline-not connected to the second of the differentially connected pair of magnetic tunnel junctions.

6. A content addressable magnetic random access memory cell comprising:
   a first magnetic tunnel junction with a first side connected through a first series connected pair of transistors to a first junction and a second magnetic tunnel junction with a first side connected through a second series connected pair of transistors to a second junction, a second side of the first magnetic tunnel junction connected to a programming bitline and a second side of the second magnetic tunnel junction connected to a programming bitline-not, and a control terminal of a first of the first series connected pair of transistors connected to an enable line and a control terminal of a first of the second series connected pair of transistors connected to the enable line;

the first junction being coupled through a first transistor to a bitline with a control terminal of the first transistor being connected to a word line, and the second junction being coupled through a second transistor to a bitline-not with a control terminal of the second transistor being connected to the word line;

the first junction being coupled through a first enable transistor to a power input terminal with a control terminal of the first enable transistor connected to the enable line, and the second junction being coupled through a second enable transistor to the power input terminal with a control terminal of the second enable transistor connected to the enable line;

the first junction being coupled through a first differential transistor to the power input terminal with a control terminal of the first differential transistor connected to a control terminal of a second of the first series connected pair of transistors and to the second junction, and the second junction being coupled through a second differential transistor to the power input terminal with a control terminal of the second differential transistor connected to a control terminal of a second of the second series connected pair of transistors and to the first junction; and a first series connected pair of match transistors connected between the power input terminal and a match line with a control terminal of a first of the first pair of match transistors connected to the bitline and a control terminal of a second of the first pair of match transistors connected to the second junction, and a second series connected pair of match transistors connected between the power input terminal and the match line with a control terminal of a first of the second pair of match transistors connected to the bitline-not and a control terminal of a second of the second pair of match transistors connected to the first junction.

7. A content addressable magnetic random access memory cell as claimed in claim 6 wherein the first and second series connected pairs of transistors, the first and second transistors, the first and second enable transistors, the first and second differential transistors, and the first and second pairs of match transistors are formed in a semiconductor substrate and the first and second magnetic tunnel junctions are formed in layers positioned on the semiconductor substrate.

8. A content addressable magnetic random access memory cell as claimed in claim 7 including in addition a digit line associated with the first and second magnetic tunnel junctions and positioned below the first and second magnetic tunnel junctions with the programming bitline being positioned above the first magnetic tunnel junction and the programming bitline-not being positioned above the second magnetic tunnel junction.

9. An array of memory cells connected to form a content addressable, nonvolatile memory comprising:

a plurality of memory cells arranged in rows and columns;

each memory cell including a differentially connected pair of magnetic tunnel junctions, and a tag bitline, a tag bitline-not, a tag program bitline, a tag program bitline-not, an enable line, a word line, a digit line, and a match line, the match line providing an indication of a match between input data placed on the differential tag bitlines and stored data in the cell;

the tag bitline, tag bitline-not, tag program bitline, tag program bitline-not, and enable line for each memory cell in a column being coupled to the tag bitline, tag bitline-not, tag program bitline, tag program bitline-not, and enable line for each other memory cell in the column, respectively;

the word line, digit line, and match line for each memory cell in a row being coupled to the word line, digit line, and match line for each other memory cell in the row; and match detection circuitry coupled to the match lines in each row.

10. An array of memory cells connected to form a content addressable, nonvolatile memory as claimed in claim 9 wherein the differentially connected pair of magnetic tunnel junctions include a plurality of transistors formed in a semiconductor substrate with the magnetic tunnel junctions formed in layers disposed on the semiconductor substrate.

11. An array of memory cells connected to form a content addressable, nonvolatile memory as claimed in claim 10 wherein each row of memory cells includes the digit line positioned below and adjacent each memory cell in the row, each column of memory cells includes the programming bitline positioned adjacent and above a first magnetic tunnel junction of the differentially connected pair of magnetic tunnel junctions in each memory cell in the column, and each column of memory cells includes the programming bitline-not positioned adjacent and above a second magnetic tunnel junction of the differentially connected pair of magnetic tunnel junctions in each memory cell in the column.

* * * * *

UNITED STATES PATENT AND TRADEMARK OFFICE
CERTIFICATE OF CORRECTION

PATENT NO.    : 6,304,477 B1  Page 1 of 1
DATED         : October 16, 2001
INVENTOR(S)   : Naji It is certified that error appears in the above-identified patent and that said Letters Patent is hereby corrected as shown below:

<u>Column 1,</u>
Line 3, please add as a new first paragraph the following paragraph:
-- This invention was made with Government support under Agreement No. MDA972-96-3-0016 awarded by DARPA. The Government has certain rights in the invention. --

Signed and Sealed this

Seventh Day of October, 2003

JAMES E. ROGAN
*Director of the United States Patent and Trademark Office*